(12) United States Patent
Nagaya et al.

(10) Patent No.: US 9,966,402 B2
(45) Date of Patent: May 8, 2018

(54) SOLID-STATE IMAGING DEVICE

(71) Applicant: JSR Corporation, Minato-ku (JP)

(72) Inventors: Katsuya Nagaya, Minato-ku (JP);
Takashi Tsubouchi, Minato-ku (JP);
Mibuko Shimada, Minato-ku (JP);
Koji Hatakeyama, Minato-ku (JP)

(73) Assignee: JSR Corporation, Minato-ku (JP)

( * ) Notice: Subject to any disclaimer, the term of this patent is extended or adjusted under 35 U.S.C. 154(b) by 0 days. days.

(21) Appl. No.: 15/531,972

(22) PCT Filed: Nov. 26, 2015

(86) PCT No.: PCT/JP2015/083241
§ 371 (c)(1),
(2) Date: Jul. 31, 2017

(87) PCT Pub. No.: WO2016/088645
PCT Pub. Date: Jun. 9, 2016

(65) Prior Publication Data
US 2017/0345860 A1    Nov. 30, 2017

(30) Foreign Application Priority Data

Dec. 4, 2014  (JP) ................................ 2014-245887

(51) Int. Cl.
*H01L 29/49* (2006.01)
*H01L 27/146* (2006.01)
(Continued)

(52) U.S. Cl.
CPC .......... *H01L 27/14621* (2013.01); *G02B 1/00* (2013.01); *G02B 5/22* (2013.01);
(Continued)

(58) Field of Classification Search
CPC ........ H01L 27/14621; H01L 27/14685; G02B 5/22
See application file for complete search history.

(56) References Cited

U.S. PATENT DOCUMENTS

| | | | |
|---|---|---|---|
| 4,730,902 A | 3/1988 | Suzuki et al. | |
| 4,767,571 A | 8/1988 | Suzuki et al. | |
| (Continued) | | | |

FOREIGN PATENT DOCUMENTS

| | | | |
|---|---|---|---|
| JP | 60-224589 A | 11/1985 | |
| JP | 60-228448 A | 11/1985 | |
| (Continued) | | | |

OTHER PUBLICATIONS

International Search Report dated Feb. 23, 2016 in PCT/JP2015/083241 (with partial English translation).

(Continued)

*Primary Examiner* — Michael Shingleton
(74) *Attorney, Agent, or Firm* — Oblon, McClelland, Maier & Neustadt, L.L.P.

(57) ABSTRACT

The present invention intends to provide a solid-state imaging device having minimum production costs and high detection accuracy. A solid-state imaging device includes a first optical layer that transmits visible light and at least a part of near-infrared light, a second optical layer that absorbs at least a part of the near-infrared light and a pixel array that includes a first light-receiving element that detects the visible light transmitted through the first optical layer and the second optical layer and a second light-receiving element that detects the near-infrared light transmitted through the first optical layer, in which the second optical layer has an opening at a part corresponding to the second light-receiving element, the first optical layer includes a compound (A) having at least one absorption maximum at the wavelength of from 750 to 900 nm, (Continued)

the second optical layer includes a compound (B) having at least one absorption maximum at the wavelength of from 755 to 1050 nm, an absorption maximum wavelength on a longest wavelength side of the compound (B) is larger than an absorption maximum wavelength on the longest wavelength side of the compound (A), and a difference between both is from 5 to 150 nm.

8 Claims, 12 Drawing Sheets

(51) Int. Cl.
  H04N 5/369      (2011.01)
  H04N 5/33       (2006.01)
  G02B 5/22       (2006.01)
  G02B 1/00       (2006.01)
(52) U.S. Cl.
  CPC ......... *H01L 27/14685* (2013.01); *H04N 5/33* (2013.01); *H04N 5/369* (2013.01); *H01L 27/14645* (2013.01)

(56) References Cited

U.S. PATENT DOCUMENTS

| | | | |
|---|---|---|---|
| 4,788,128 A | 11/1988 | Barlow | |
| 4,857,431 A | 8/1989 | Kato et al. | |
| 5,296,519 A | 3/1994 | Otsuka et al. | |
| 5,359,056 A | 10/1994 | Kaieda et al. | |
| 5,405,976 A | 4/1995 | Telfer et al. | |
| 5,523,027 A | 6/1996 | Otsuka | |
| 5,604,281 A | 2/1997 | Kamei et al. | |
| 5,998,609 A | 12/1999 | Aoki et al. | |
| 6,020,490 A | 2/2000 | Reinehr et al. | |
| 6,069,244 A | 5/2000 | Masuda et al. | |
| 6,323,340 B1 | 11/2001 | Masuda et al. | |
| 2003/0234995 A1 | 12/2003 | Masuda et al. | |
| 2004/0137367 A1 | 7/2004 | Kitayama et al. | |
| 2006/0000388 A1 | 1/2006 | Campbell et al. | |
| 2006/0073407 A1 | 4/2006 | Yamanobe et al. | |
| 2016/0118430 A1* | 4/2016 | Nam ................. H01L 27/14627 257/432 | |
| 2016/0315112 A1* | 10/2016 | Park ................. H01L 27/14623 | |
| 2017/0170220 A1* | 6/2017 | Nam ................. H01L 27/14605 | |

FOREIGN PATENT DOCUMENTS

| | | |
|---|---|---|
| JP | 61-32003 A | 2/1986 |
| JP | 61-42585 A | 3/1986 |
| JP | 61-80106 A | 4/1986 |
| JP | 62-39682 A | 2/1987 |
| JP | 63-124054 A | 5/1988 |
| JP | 64-74272 A | 3/1989 |
| JP | 1-113482 A | 5/1989 |
| JP | 1-114801 A | 5/1989 |
| JP | 1-146846 A | 6/1989 |
| JP | 1-228960 A | 9/1989 |
| JP | 4-23868 A | 1/1992 |
| JP | 4-39361 A | 2/1992 |
| JP | 5-78364 A | 3/1993 |
| JP | 5-222047 A | 8/1993 |
| JP | 5-222301 A | 8/1993 |
| JP | 5-222302 A | 8/1993 |
| JP | 5-345861 A | 12/1993 |
| JP | 6-25548 A | 2/1994 |
| JP | 6-107663 A | 4/1994 |
| JP | 6-192584 A | 7/1994 |
| JP | 6-228533 A | 8/1994 |
| JP | 7-118551 A | 5/1995 |
| JP | 7-118552 A | 5/1995 |
| JP | 8-27371 A | 1/1996 |
| JP | 8-120186 A | 5/1996 |
| JP | 8-225751 A | 9/1996 |
| JP | 9-202860 A | 8/1997 |
| JP | 10-120927 A | 5/1998 |
| JP | 10-180922 A | 7/1998 |
| JP | 10-182995 A | 7/1998 |
| JP | 2846091 B2 | 1/1999 |
| JP | 11-35838 A | 2/1999 |
| JP | 2864475 B2 | 3/1999 |
| JP | 11-152413 A | 6/1999 |
| JP | 11-152414 A | 6/1999 |
| JP | 11-152415 A | 6/1999 |
| JP | 2000-26748 A | 1/2000 |
| JP | 2000-63691 A | 2/2000 |
| JP | 3094037 B2 | 10/2000 |
| JP | 2001-106689 A | 4/2001 |
| JP | 3366697 B2 | 1/2003 |
| JP | 2004-18561 A | 1/2004 |
| JP | 2005-220060 A | 8/2005 |
| JP | 3699464 B2 | 9/2005 |
| JP | 3703869 B2 | 10/2005 |
| JP | 2005-537319 A | 12/2005 |
| JP | 2007-31644 A | 2/2007 |
| JP | 2007-39343 A | 2/2007 |
| JP | 2007-169315 A | 7/2007 |
| JP | 2007-169343 A | 7/2007 |
| JP | 2007-246464 A | 9/2007 |
| JP | 2007-271745 A | 10/2007 |
| JP | 2007-334325 A | 12/2007 |
| JP | 2008-9206 A | 1/2008 |
| JP | 4081149 B2 | 4/2008 |
| JP | 2009-108267 A | 5/2009 |
| JP | 2009-185161 A | 8/2009 |
| JP | 2009-191213 A | 8/2009 |
| JP | 2009-215542 A | 9/2009 |
| JP | 2010-241873 A | 10/2010 |
| JP | 2011-38007 A | 2/2011 |
| JP | 2011-68731 A | 4/2011 |
| JP | 4740631 B2 | 8/2011 |
| JP | 2012-215806 A | 11/2012 |
| JP | 2013-155353 A | 8/2013 |
| JP | 2013-195480 A | 9/2013 |
| JP | 2013-253224 A | 12/2013 |
| JP | 2014-26070 A | 2/2014 |
| JP | 2014-26178 A | 2/2014 |
| JP | 2014-32380 A | 2/2014 |
| JP | 2014-103657 A | 6/2014 |
| JP | 2014-130343 A | 7/2014 |
| JP | 2014-139616 A | 7/2014 |
| JP | 2014-139617 A | 7/2014 |
| WO | WO 2003/005076 A1 | 1/2003 |
| WO | WO 2004/048480 A1 | 6/2004 |
| WO | WO 2005/044782 A1 | 5/2005 |
| WO | WO 2006/120888 A1 | 11/2006 |
| WO | WO 2007/148595 A1 | 12/2007 |
| WO | WO 2011/118171 A1 | 9/2011 |

OTHER PUBLICATIONS

Written Opinion of the International Searching Authority dated Feb. 23, 2016 in PCT/JP2015/083241 filed Nov. 26, 2015 (with partial English translation).
"Phthalocyanine-Chemistry and Function", IPC, 1997, pp. 1-29.

\* cited by examiner (A)

(B)

SOLID-STATE IMAGING DEVICE

TECHNICAL FIELD

The present invention relates to a solid-state imaging device, in particular, to a solid-state imaging device that uses a dual band pass fitter and a near-infrared cut filter.

BACKGROUND ART

As a photoelectric conversion device, a solid-state imaging device used in an imaging device such as a camera or the like has been known. The solid-state imaging device includes light-receiving elements (visible-light detection sensor) that detect visible light for every pixel, generate an electric signal corresponding to visible light incident from the outside, and process the electric signal to form a captured image. As the light-receiving element, a CMOS image sensor or a CCD image sensor, which is formed according to a semiconductor process is broadly known.

The above solid-state imaging device blocks light other than visible light, which becomes a noise component, in order to accurately detect an intensity of the visible light incident on the light-receiving element. For example, there is a technology in which before the incident light reaches the light-receiving element, an infrared component is blocked with an infrared cut filter. In this case, since substantially only visible light reaches the light-receiving element, a sensing operation having a relatively low noise component may be realized.

On the other hand, recent years, there is an increasing demand for providing a sensing function such as motion capture or distance cognition (space cognition), which uses a near-infrared light, to the solid-state imaging device. As a technology for this, a study for incorporating a distance image sensor that adopts a TOF (Time Of Flight) method in the solid-state imaging device has been forwarded.

The TOF method is a technology that measures a distance from a light source to an object to be imaged by measuring a time until light output from a light source is reflected by the object to be imaged and returns. For measuring a time, a phase difference of light is used. That is, since a phase difference is generated in the returned light depending on the distance to the object to be imaged, in the TOF method, this phase difference is converted into a time difference, and based on the time difference and a speed of light, the distance up to the object to be imaged is measured for every pixel.

Since the solid-state imaging device that adopts the TOF method like this is necessary to detect an intensity of the visible light and an intensity of the near-infrared light for every pixel, it is necessary for each of the pixels to be provided with a light-receiving element for detecting the visible light and a light-receiving element for detecting the near-infrared light. For example, as an example where the light-receiving element for detecting visible light and the light-receiving element for detecting near-infrared light are provided for every pixel, a technology described in Patent Literature 1 is known.

In the Patent Literature 1, an image sensing device in which an optical filter array containing a dual band pass filter and an infrared pass filter and a pixel array containing a RGB pixel array and a TOF pixel array are combined is disclosed. According to the technology described in the Patent Literature 1, the dual band pass filter allows selective transmission of the visible light and the infrared light, and the infrared pass filter provided only on the TOF pixel array allows transmission of the infrared light. Thus, since the visible light and the infrared light are incident on the RGB pixel array and the infrared light is incident on the TOF pixel array, each pixel array may detect necessary light ray.

PRIOR ART

Patent Literature

Patent Literature 1: JP 2014-103657 A

SUMMARY OF THE INVENTION

Problem to be Solved by the Invention

However, when the technology described in the Patent Literature 1 is used, since both of visible light and infrared light are input in the RGB pixel array, there is a problem that due to the noise of the infrared light, it is difficult to detect only the visible light accurately. Further, although the Patent Literature 1 discloses also a constitution in which a visible pass filter is provided on the RGB pixel array, in this case, because it is necessary to provide both of the visible pass filter and the infrared pass filter, there is a problem that the production costs increase.

The present invention has been carried out in view of the above problems and intends to provide a solid-state imaging device that has minimum production costs and high detection accuracy.

Means for Solving the Problems

A solid-state imaging device according to one embodiment of the present invention is a solid-state imaging device that includes a first optical layer that transmits visible light and at least a part of near-infrared light, a second optical layer that absorbs at least a part of the near-infrared light, and a pixel array that includes a first light-receiving element that detects the visible light transmitted through the first optical layer and the second optical layer and a second light-receiving element that detects the near-infrared light transmitted through the first optical layer, in which the second optical layer has an opening at a part corresponding to the second light-receiving element, the first optical layer includes a compound (A) having at least one absorption maximum at the wavelength of from 600 to 900 nm, the second optical layer includes a compound (B) having at least one absorption maximum at the wavelength of from 755 to 1050 nm, an absorption maximum wavelength on a longest wavelength side of the compound (B) is larger than an absorption maximum wavelength on the longest wavelength side of the compound (A), and a difference between both is from 5 to 150 nm.

Regarding an arrangement order (hierarchical relationship) of the first optical layer and the second optical layer, any one may be located above.

However, it is preferable to arrange the first optical layer above the second optical layer (a side on which incident light collides first) such that the second optical layer absorbs at least a part of the near-infrared light transmitted through the first optical layer.

The first optical layer may include a translucent resin composition containing the compound (A). The compound (A) may contain a coloring material that partially absorbs the near-infrared light. For example, as the compound (A), at least one kind of compound selected from the group consisting of squarylium-based compounds, phthalocyanine-based compounds, naphthalocyanine-based compounds, croconium-based compounds, hexaphyrin-based compounds and cyanine-based compounds may be used, and the squarylium-based compounds are preferably used. The absorption maximum wavelength of the compound (A) is from 600 to 900 nm, preferably from 750 to 900 nm, more preferably from 620 to 870 nm, still more preferably from 640 to 850 nm, and particularly preferably from 660 to 830 nm. When the absorption maximum wavelength of the compound (A) is in the range like this, the selective near-infrared absorption/transmission characteristics required as the dual band pass filter may be achieved.

The second optical layer may contain a curable resin composition containing the compound (B). The compound (B) may also have an absorption maximum at the wavelength of from 820 to 880 nm. For example, the compound (B) may contain at least one kind selected from the group consisting of diiminium-based compounds, squarylium-based compounds, cyanine-based compounds, phthalocyanine-based compounds, naphthalocyanine-based compounds, quaterrnylene-based compounds, aminium-based compounds, iminium-based compounds, azo-based compounds, anthraquinone-based compounds, porphyrine-based compounds, pyrrolopyrrole-based compounds, oxonol-based compounds, croconium-based compounds, hexaphyrin-based compounds, metal dithiol-based compounds, and copper compounds.

Here, compounds that may be used as the above compound (B) will be illustrated in more detail.

Specific examples of the above diiminium (diimmonium)-based compounds include compounds described in JP H01-113482 A, JP H10-180922 A, WO 2003/5076, WO 2004/48480, WO 2005/44782, WO 2006/120888, JP 2007-246464 A, WO 2007/148595, JP 2011-038007 A and paragraph 0118 of WO 2011/118171 or the like. Examples of commercially available products include EPOLIGHT series such as EPOLIGHT 1178 or the like (manufactured by Epolin Inc.), CIR-108X series and CIR-96X series such as CIR-1085 or the like (manufactured by Japan Carlit Co., Ltd.), and IRG022, IRG023 and PDC-220 (manufactured by Nippon Kayaku Co., Ltd.).

Specific examples of the above cyanine-based compounds include compounds described in paragraphs 0041 to 0042 of JP 2007-271745 A, paragraphs 0016 to 0018 of JP 2007-334325 A, JP 2009-108267 A, JP 2009-185161 A, JP 2009-191213 A, paragraph 0160 of JP 2012-215806 A, paragraphs 0047 to 0049 of JP 2013-155353 A or the like. Examples of commercially available products include Daito chmix 1371F (manufactured by DAITO CHEMIX Co., Ltd.), NK series such as NK-3212, NK-5060 or the like (manufactured by Hayashibara Co., Ltd.) and the like.

Specific examples of the above phthalocyanine-based compounds include compounds described in JP S60-224589 A, JP 2005-537319 A, JP H04-23868 A, JP H04-39361 A, JP H05-78364 A, JP H05-222047 A, JP H05-222301 A, JP H05-222302 A, JP H05-345861 A, JP H06-25548 A, JP H06-107663 A, JP H06-192584 A, JP H06-228533 A, JP H07-118551 A, JP H07-118552 A, JP H08-120186 A, JP H08-225751 A, JP H09-202860 A, JP H10-120927 A, JP H10-182995 A, JP H11-35838 A, JP 2000-26748 A, JP 2000-63691 A, JP 2001-106689 A, JP 2004-18561 A, JP 2005-220060 A. JP 2007-169343 A, paragraphs 0026 to 0027 of JP 2013-195480 A and the like. Examples of commercially available products include FB series such as FB-22, 24 and the like (manufactured by Yamada Kagaku Co., Ltd.), Excolor series, Excolor TX-EX 720, Excolor TX-EX 708K (manufactured by NIPPON SHOKUBAI CO., LTD.), Lumogen IR788 (manufactured by BASF), ABS643, ABS654, ABS667, ABS670T, IRA693N, and IRA735 (manufactured by Exciton Inc.), SDA3598, SDA6075, SDA8030, SDA8303, SDA8470, SDA3039, SDA3040, SDA3922 and SDA7257 (manufactured by H. W. SANDS), and TAP-15 and IR-706 (manufactured by Yamada Kagaku Co., Ltd.), and the like.

Specific examples of the above naphthalocyanine-based compounds include compounds described in JP H11-152413 A, JP H11-152414 A, JP H11-152415 A, paragraphs 0046 to 0049 of JP 2009-215542 A and the like.

Specific examples of the above quaterrylene-based compounds include compounds described in paragraph 0021 of JP 2008-009206 A and the like.

Examples of commercially available products include Lumogen IR765 (manufactured by BASF) and the like.

Specific examples of the above aminium-based compounds include compounds described in paragraph 0018 of JP H08-027371 A, JP 2007-039343 A and the like. Examples of commercially available products include IRG002 and IRG003 (manufactured by Nippon Kayaku Co., Ltd.) and the like.

Specific examples of the above iminium-based compounds include compounds described in paragraph 0116 of WO2011/118171 and the like.

Specific examples of the above azo-based compounds include compounds described in paragraphs 0114 to 0117 of JP 2012-215806 A and the like.

Specific examples of the above anthraquinone-based compounds include compounds described in paragraphs 0128 and 0129 of JP 2012-215806 A and the like.

Specific examples of the above pyrrolopyrrole-based compounds include compounds described in JP 2011-068731 A, paragraphs 0014 to 0027 of JP 2014-130343 A and the like.

Specific examples of the above oxonol-based compounds include compounds described in paragraph 0046 of JP 2007-271745 A and the like.

Specific examples of the above croconium-based compounds include compounds described in paragraph 0049 of JP 2007-271745 A, JP 2007-31644 A, JP 2007-169315 A and the like.

Specific examples of the above metal dithiol-based compounds include compounds described in JP H01-114801 A, JP S64-74272 A, JP 862-39682 A, JP 861-80106 A, JP 861-42585 A, JP 861-32003 A and the like.

The above copper compound is preferably a copper complex, and specific examples thereof include compounds described in JP 2013-253224 A, JP 2014-032380 A, JP 2014-026070 A, JP 2014-026178 A, JP 2014-139616 A, JP 2014-139617 A and the like.

When the above-described compound is an organic solvent, it may be used also as a laked coloring material. As a method of manufacturing the laked coloring material, a well-known method may be used, for example, JP 2007-271745 A or the like may be referenced.

Effects of the Invention

According to the present invention, a solid-state imaging device that has minimum production costs and high detection accuracy may be realized.

EMBODIMENTS OF THE INVENTION

Figure 1:
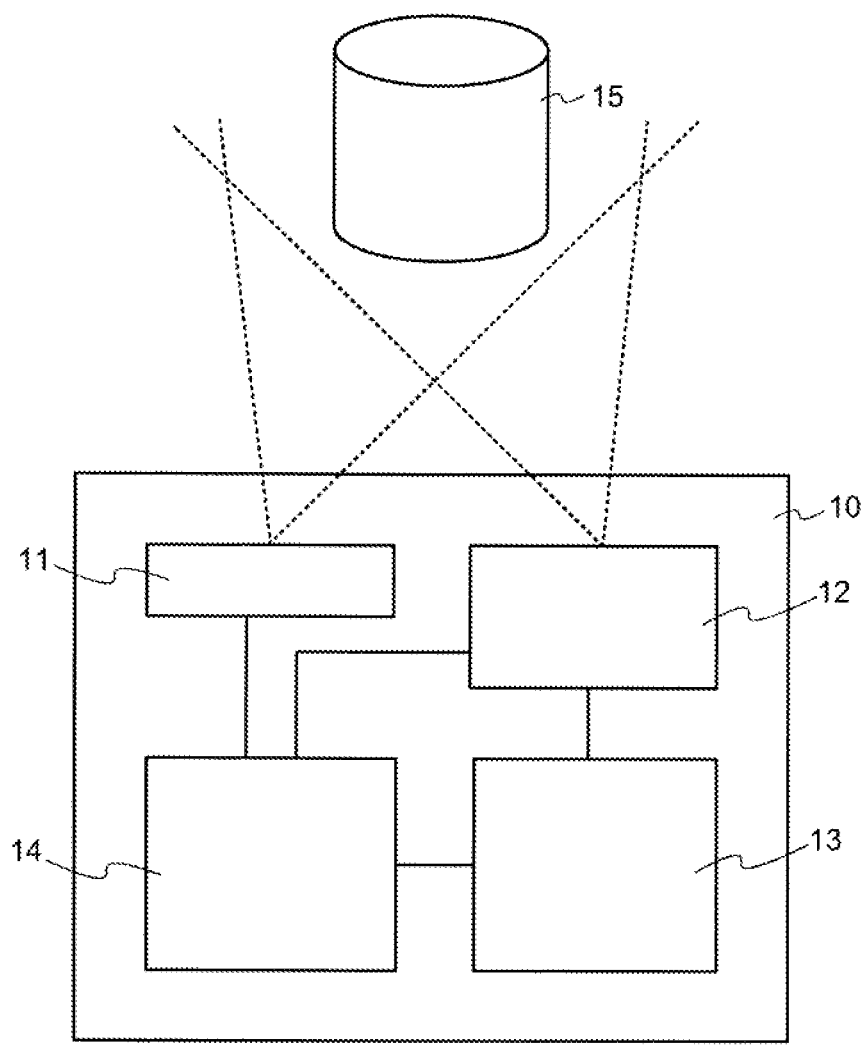
FIG. 1 is a conceptional diagram showing an example of application of a solid-state imaging device according to one embodiment of the present invention.

In what follows, a solid-state imaging device according to one embodiment of the present invention will be described in more detail with reference to the drawings. An embodiment shown below is an example of embodiments of the present invention and the present invention is not limited to embodiments described here.

In the drawings referenced in the present embodiments, the like reference sign or similar reference sign (reference sign with only A or B after reference sign) denotes the like part or the similar function, and the explanation thereof may be omitted from repeating. Further, dimensional ratios of the drawings may be different from actual ratios for the convenience of description, or a part of the constitution may be omitted from describing in the drawing.

Further, in the structural expression in the present specification, description such as "above" or "upward" indicates a relative direction with a main surface (a surface on which the solid-state imaging element is placed) of a support substrate as a basis, and indicates a direction departing from the main surface of the support substrate. On the contrary, description such as "below" or "downward" indicate a direction approaching the main surface of the support substrate.

FIG. 1 shows an example of application of the solid-state imaging device according to one embodiment of the present invention. Specifically, FIG. 1 shows an example where the solid-state imaging device of the present embodiment is applied to an imaging device of the TOF method (for example, a distance image camera). The imaging device described here is consistently a conceptional diagram and it is not limited to add or remove other elements.

In FIG. 1, an imaging device (camera) 10 includes a light source 11, a solid-state imaging device (image sensor) 12, a signal processor 13, and a main controller 14 as fundamental constitutional elements. The main controller 14 is connected with the light source 11, the solid-state imaging device 12 and the signal processor 13 and plays a role of controlling respective operations. The solid-state imaging device 12 is further connected also with the signal processor 13 and transmits an electric signal generated in the solid-state imaging device 12 to the signal processor 13.

As the light source 11, a well-known light-emitting diode (LED) that outputs near-infrared light may be used. The near-infrared light output from the light source 11 collides with an object to be imaged 15 and is reflected, and this reflected light is incident on the solid-state imaging device 12. At this time, between the near-infrared light output from the light source 11 and the near-infrared light returned from the object to be imaged 15, a phase difference is generated depending on a three-dimensional shape of the object to be imaged 15.

As the solid-state imaging device 12, a CMOS image sensor or a CCD image sensor may be used. Although any one of a front side illumination type and a back side illumination type may be used as the CMOS image sensor, in the present embodiment, the back side illumination type CMOS sensor having high sensitivity will be used.

Ambient visible light reflected by the object to be imaged 15 and the near-infrared light output from the light source 11 are incident on a solid-state imaging element (also referred to as a photoelectric conversion element or a sensor element) in the solid-state imaging device 12 and converted into an electric signal corresponding to a light amount. The converted electric signal is digitized by an AD converter provided in the solid-state imaging device 12 and is output to the signal processor 13 as a digital signal. A specific structure of the solid-state imaging device 12 will be described below.

The signal processor 13 receives the digital signal output from the solid-state imaging device 12 and processes the signal, and forms an image based on the object to be imaged 15. At this time, the digital signal based on the visible light is used as information for reconstructing a color or a shape of the object to be imaged 15, and the digital signal based on the near-infrared light is used as information for recognizing a distance to the object to be imaged 15. Due to these digital signals, the object to be imaged 15 may be three-dimensionally captured.

The main controller 14 is an arithmetic processor with a CPU at a center, controls the light source 11, the solid-state imaging device 12 and the signal processor 13, and controls also other processors not shown in the drawing based on information obtained from the signal processor 13.

Figure 2:
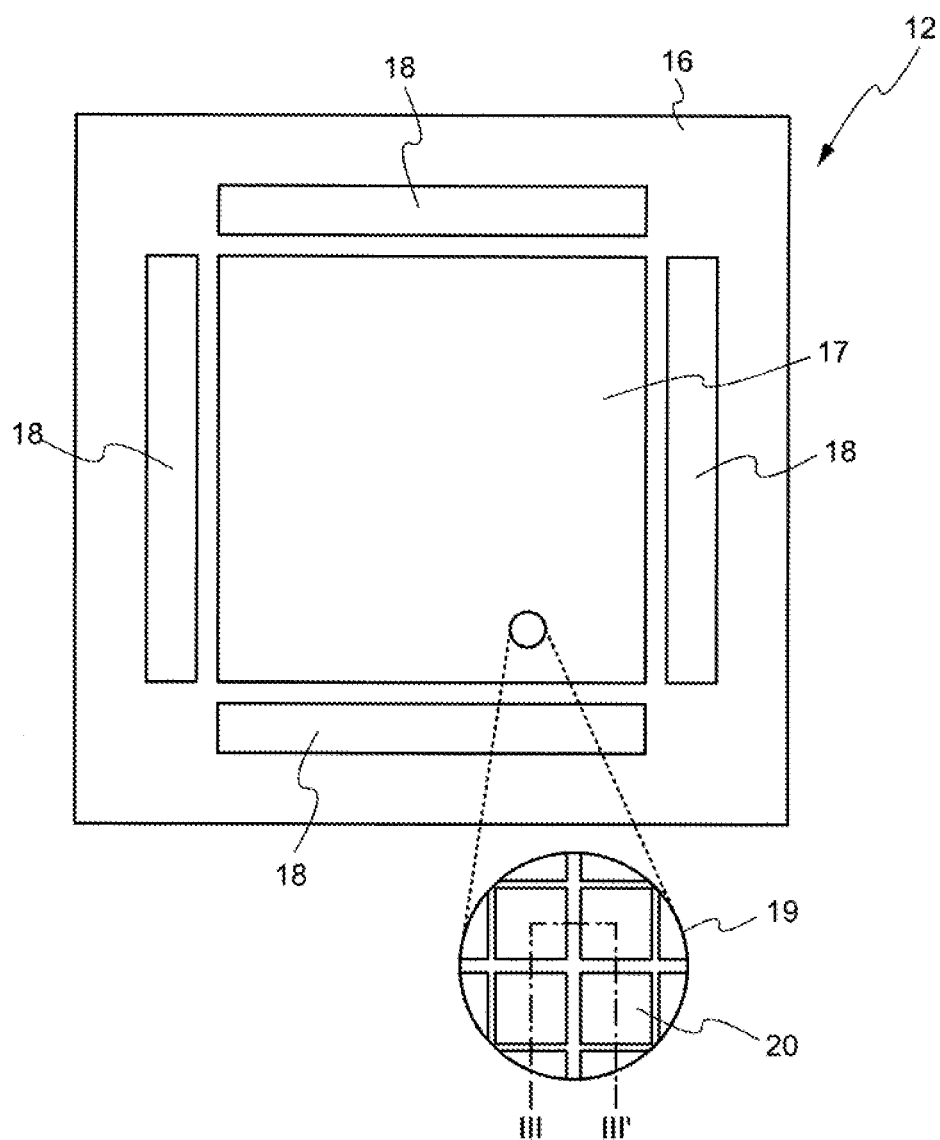
FIG. 2 is a plan view of the solid-state imaging device according to one embodiment of the present invention.

FIG. 2 is a plan view for explaining an outline of the solid-state imaging device 12. On a package 16, a pixel part 17 and a terminal part 18 are arranged.

Between the pixel part 17 and the terminal part 18, an AD converter may be provided. An enlargement part 19 shows a situation where a part of the pixel part 17 is enlarged. As shown in the enlargement part 19, the pixel part 17 is provided with a plurality of pixels 20 in a matrix-shape.

In FIG. 2, although only simple structures like the pixel part 17 and the terminal part 18 are shown, the solid-state imaging device of the present embodiment is not limited to this. For example, it is also possible to make a function as the signal processor 13 shown in FIG. 1 incorporate in the solid-state imaging device 12 shown in FIG. 2. Further, by making an arithmetic processing capacity equivalent with the main controller 14 shown in FIG. 1 incorporate, a system IC circuit provided with an imaging function and an arithmetic function in one chip may be formed.

(Structure of Solid-State Imaging Device)

Figure 3:
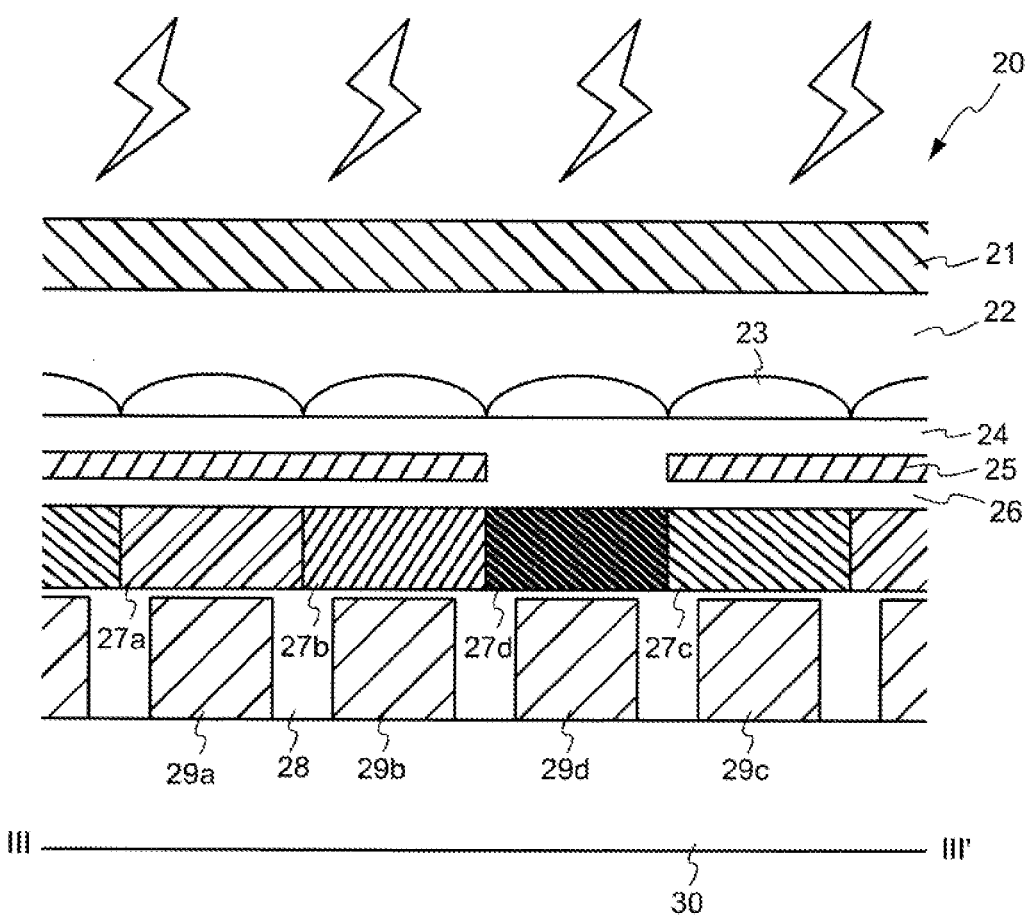
FIG. 3 is a cross-sectional diagram showing an outline of the solid-state imaging device according to one embodiment of the present invention.

FIG. 3 is a cross-sectional view obtained by cutting the pixel 20 shown in FIG. 2 by III-III'. In FIG. 3, from a side where ambient light is incident, a first optical layer 21, a first gap 22, a micro-lens array 23, a second gap 24, a second optical layer 25, a third gap 26, visible pass filters (color resist) 27a to 27c, a near-infrared pass filter 27d, an insulator 28, photodiodes 29a to 29d, and a support substrate 30 are illustrated. The first gap 22, the second gap 24 and the third gap 26 may be secured as a space filled with air or inert gas or may be secured as an insulator formed of an organic insulation film or an inorganic insulation film.

In the present specification, the pixels constituted of the visible pass filters 27a to 27c and the photodiodes 29a to 29c arranged corresponding thereto are called as a "visible light detection pixel" and the pixels constituted of the near-infrared pass filter 27d and the photodiode 29d are called as a "near-infrared light detection pixel".

Here, the first optical layer 21 is an optical layer that transmits visible light and at least a part of the near-infrared light, for example, the visible light of the wavelength of from 400 to 700 nm and the near-infrared light of the wavelength of from 750 to 2500 nm (typically, 750 to 950 nm) are transmitted. Needless to say, without limiting the wavelength bands to be transmitted to the range described here, visible lights corresponding to R (red), G (green) and B (blue) and the near-infrared light of the wavelength band capable of detecting with a near-infrared light detection pixel described below may be transmitted. A filter provided with optical characteristics of transmitting different two wavelength bands like this is generally called as a dual band pass filter.

Now, in the present embodiment, an optical layer in which a dielectric multilayer film is provided on a base material (film) having a transparent resin (a resin having translucency) layer containing a compound having specific optical characteristics is used as the first optical layer 21. As the compound having specific optical characteristics, for example, a compound that absorbs a part of the near-infrared light is used. Specifically, a compound having at least one absorption maximum at the wavelength of from 750 to 900 nm may be used as the compound (A). As such compounds, at least one kind selected from the group consisting of, for example, squarylium-based compounds, phthalocyanine-based compounds, naphthalocyanine-based compounds, croconium-based compounds, hexaphyrin-based compounds and cyanine-based compounds may be used, and the squarylium-based compounds are preferably used.

Thus, when the dielectric multilayer film is provided on the base material having a transparent resin layer containing a compound that absorbs a part of the near-infrared light, a dual band pass filter that transmits the visible light and at least a part of the near-infrared light may be formed. At this time, the base material may be a single layer or a multilayer. In the case of the single layer, a flexible base material made of a transparent resin layer may be formed. In the case of the multilayer, for example, a base material in which a transparent resin layer containing the compound (A) and a curable resin is laminated on a transparent substrate such as a glass substrate or a resin substrate, or a base material in which a resin layer such as an overcoat layer containing a curable resin is laminated on a transparent substrate containing the compound (A) may be used.

As was described above, when the first optical layer 21 is formed of a resin base material, thinness and breaking resistance may be combined more than those of a general glass dual band pass filter, for example, a film-like dual band pass filter may be formed. That is, when a structure in which the dielectric multilayer film is laminated on the base material having the transparent resin layer containing the above compound (A) is formed, a thickness of the first optical layer 21 may be made, for example, 200 μm or thinner, preferably 180 μm or thinner, more preferably 150 μm or thinner, and particularly preferably 120 μm or thinner.

A position of individual micro-lens of the micro-lens array 23 corresponds to a position of each pixel, and an incident light focused by each micro-lens is received by corresponding each pixel (specifically, each photodiode). The micro-lens array 23 may be also formed on chip because it may be formed using a resin material. For example, with an insulator as the second gap 24, by processing the resin material coated thereon, the micro-lens array 23 may be formed. Further, with a base material (film) made of a resin as the second gap 24, after forming the micro-lens array 23 by processing the resin material coated thereon, the base material may be incorporated in the solid-state imaging device 12 in the form of adhering the base material.

The second optical layer 25 is an optical layer that absorbs at least a part of the near-infrared light and contains a compound (hereinafter, referred to as compound (B)) having at least one absorption maximum at the wavelength of, for example, from 755 to 1050 nm. As the compound (B), at least one kind of compound selected from the group consisting of, for example, diiminium-based compounds, squarylium-based compounds, cyanine-based compounds, phthalocyanine-based compounds, naphthalocyanine-based compounds, quaterrylene-based compounds, aminium-based compounds, iminium-based compounds, azo-based compounds, anthraquinone-based compound, porphyrine-based compounds, pyrrolopyrrole-based compounds, oxonol-based compounds, croconium-based compound, hexaphyrin-based compounds, metal dithiol-based compounds, copper compounds, tungsten compounds and metal borides may be contained. The second optical layer 25 functions as a near-infrared cut filter that absorbs a part of the near-infrared light depending on the optical characteristics of the compound (B).

The second optical layer 25 has an opening in a part corresponding to a near-infrared light detection pixel (specifically, photodiode 29d). That is, such that the near-infrared light reaches as it is the photodiode 29d, the photodiode 29d has a structure in which an opening is provided in the upside of the photodiode 29d such that the near-infrared light is not disturbed from entering. In other words, the "part corresponding to the photodiode 29d" in the second optical layer 25 indicates an upside of the photodiode 29d, that is, a part where an optical path of the near-infrared light directing to the photodiode 29d and the second optical layer 25 intersect.

Thus, the second optical layer 25 is arranged such that the upside of the part (that is, visible light detection pixel) other than the near-infrared light detection pixel is covered. Thus, the near-infrared light is suppressed as much as possible from reaching the visible light detection pixel. As a result, in the visible light detection pixel, a noise component may be reduced and detection accuracy of the visible light may be improved.

On the lower side of the second optical layer 25, a pixel group including the above visible light detection pixel and near-infrared light detection pixel is placed. As was described above, in the present embodiment, the photodiodes 29a to 29c and the visible pass filters 27a to 27c correspond respectively with each other to constitute a visible light detection pixel. Further, the photodiode 29d and the near-infrared pass filter 27d correspond to constitute the near-infrared light detection pixel. In the present embodiment, the photodiodes 29a to 29c are called as "first light-receiving elements" and the photodiode 29d is called as a "second light-receiving element".

In actuality, the visible pass filters 27a to 27c are formed of pass filters each of which transmits visible light having different wavelengths. For example, the visible pass filter may contain a pass filter 27a that transmits a green light, a pass filter 27b that transmits a red light, and a pass filter 27c that transmits blue light. Therefore, pixels corresponding to these individual colors may be called a green color light detection pixel, a red color light detection pixel and a blue color light detection pixel, respectively.

Further, as each of the visible pass filters 27a to 27c and the near-infrared pass filter 27d, a resin material containing a coloring material (a pigment or a dye) having an absorption in a specific wavelength may be used. For example, the near-infrared pass filter 27d may be formed with a curable composition containing a coloring material having an absorption in the wavelength region of the visible light and a curable component. One or more coloring materials having an absorption in the wavelength region of the visible light may be contained or a plurality of coloring materials may be combined.

The above photodiodes 29a to 29d may be formed on a surface of a silicon substrate with the silicon substrate as a support substrate 30 according to a well-known semiconductor process. It goes without saying that the photodiodes 29a to 29d may be formed with a substrate such as glass, ceramic or a resin as the support substrate 30 according to the well-known thin film forming technology.

In the present embodiment, the photodiode 29a is used as a light-receiving element for receiving green light of the wavelength of from 520 to 560 nm, the photodiode 29b is used as a light-receiving element for receiving red light of the wavelength of from 580 to 620 nm, and the photodiode 29c is used as a light-receiving element for receiving blue light of the wavelength of from 430 to 470 nm. Thus, in the solid-state imaging device 12 of the present embodiment, the visible light incident from the outside is detected with these photodiodes 29a to 29c.

On the other hand, the photodiode 29d functions as a light-receiving element for receiving the near-infrared light of the wavelength of from 750 to 2500 nm (typically wavelength of from 750 to 950 nm) and the photodiode 29d detects the near-infrared light incident from the outside.

(Manufacturing Method of Solid-State Imaging Device)

One example of a manufacturing method of the pixel 20 will be described with reference to FIG. 3. First, a silicon substrate is prepared as the support substrate 30, and the photodiodes 29a to 29d are formed according to a well-known semiconductor process. For example, an n-type region is formed by adding an n-type impurity such as phosphorus or the like to the silicon substrate, and in which a p-type impurity such as boron or the like is added to form a p-type region to obtain a pn-junction. Then, by forming a wiring such that a current may be extracted from the n-type region and the p-type region, the photodiodes 29a to 29d may be formed.

After forming the photodiodes 29a to 29d, an insulator 28 is formed by a CVD (Chemical Vapor Deposition) or the like to cover the photodiodes 29a to 29d. As the insulator 28, an inorganic insulation layer containing silicon oxide or the like is used, or an organic insulation layer containing a resin may be used. At this time, a film thickness of a degree that may flatten an undulation due to the photodiodes 29a to 29d is preferable.

After forming the insulator 28, the visible pass filters 27a to 27c are formed. The visible pass filters 27a to 27c may be obtained by forming a structure constituted of a curable composition containing a curable component containing, for example, a coloring material that absorbs light of a particular wavelength on a desired position by a printing method.

Next, an insulation layer having translucency is formed on the visible pass filters 27a to 27d as a gap 26. For example, a silicon oxide layer or an organic resin layer may be formed as the insulation layer having the translucency. When the insulation layer having translucency is used as the gap 26, the undulation due to the visible pass filters 27a to 27d may be flattened. Therefore, the second optical layer 25 formed on the gap 26 may be flattened, and the uniformity of the optical characteristics of the second optical layer 25 may be improved.

After forming the silicon oxide layer as the gap 26, the second optical layer 25 is formed. As the second optical layer 25, a curable resin composition containing the above compound (B) is used. For example, by means of the spin coating, the curable resin composition containing the compound (B) is coated to form the second optical layer 25. On a part corresponding to the near-infrared pass filter 27d, an opening may be formed according to a well-known photolithography method.

Next, an insulation layer having the translucency is once more formed on the second optical layer 25 as the gap 24. Also in this case, for example, the silicon oxide layer or the organic resin layer may be formed as the insulation layer having translucency. Further, when the insulation layer having translucency is used as the gap 24, the undulation due to the opening provided to the second optical layer 25 may be flattened.

After forming the insulation layer having translucency as the gap 24, the micro-lens array 23 is formed corresponding to the respective photodiodes 29a to 29d. The micro-lens array 23 may be formed by adhering a ready-made micro-lens array or may be formed also by processing a resin layer. For example, after coating the resin layer by the spin coating or the like followed by curing, by dry-etching or the like with a desired region masked, a plurality of lens-shaped structures may be formed.

After the micro-lens array 23 is formed, the resin layer is formed as a gap 22, and the first optical layer 21 is adhered thereon. For example, a resin material is coated by means of the spin coating or the like, on which the first optical layer 21 that has been formed is placed, and in this state, the resin material is cured. Thus, by using the resin layer formed as the gap 22, the first optical layer 21 maybe adhered. It goes without saying that after curing the resin layer, the first optical layer 21 may be adhered with an adhesive.

According to the procedure as described above, the pixel 20 shown in FIG. 3 may be formed. The manufacturing method described here is only one example, and regarding materials used and a forming method of the film, an appropriate alternative method may be used.

Figure 4:
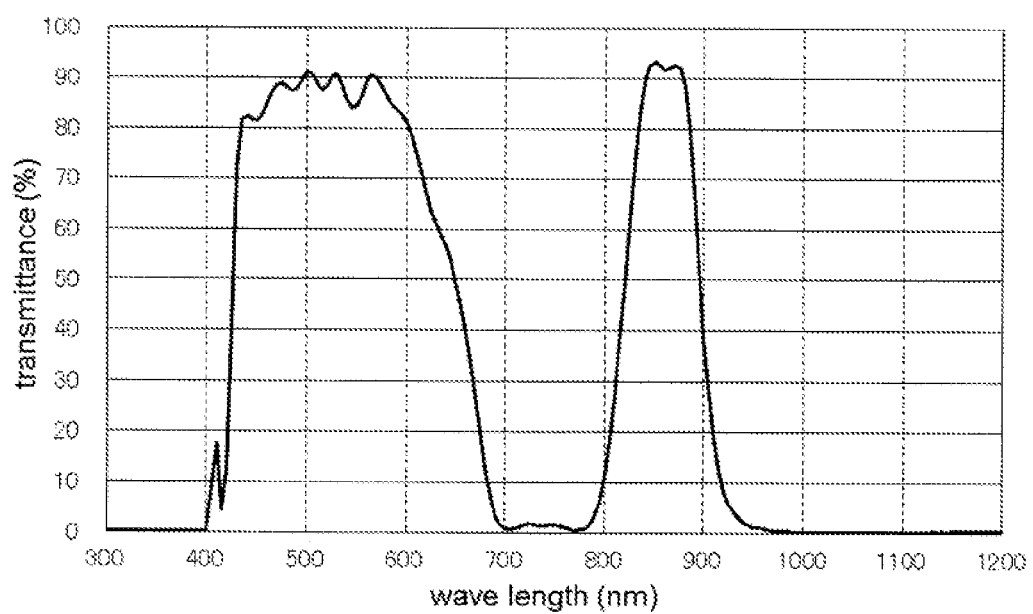
FIG. 4 is a diagram showing a transmission spectrum of a first optical layer that is used in the solid-state imaging device according to one embodiment of the present invention.
Figure 5:
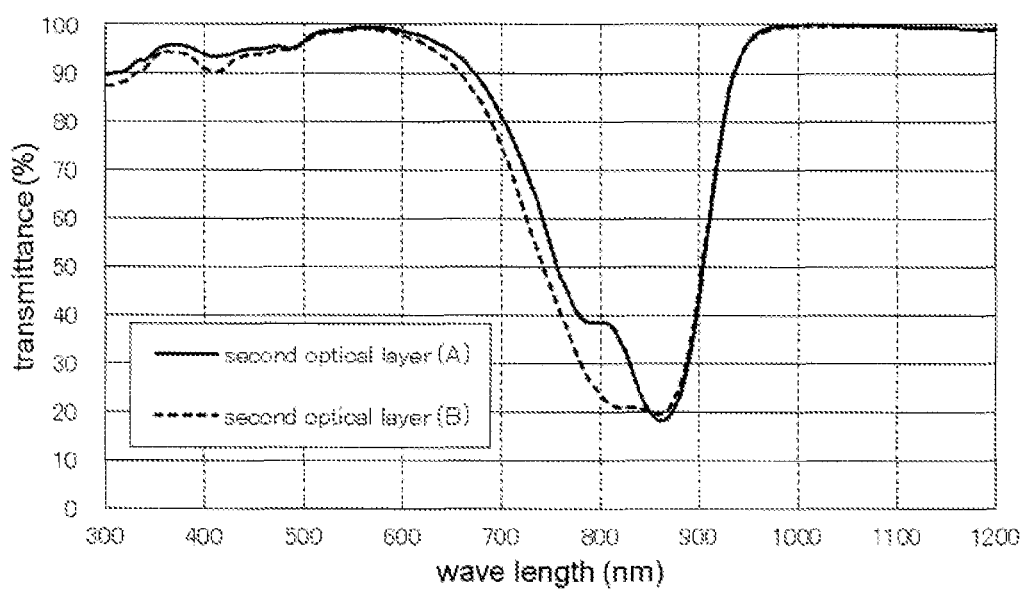
FIG. 5 is a diagram showing a transmission spectrum of a second optical layer that is used in the solid-state imaging device according to one embodiment of the present invention.
Figure 6:
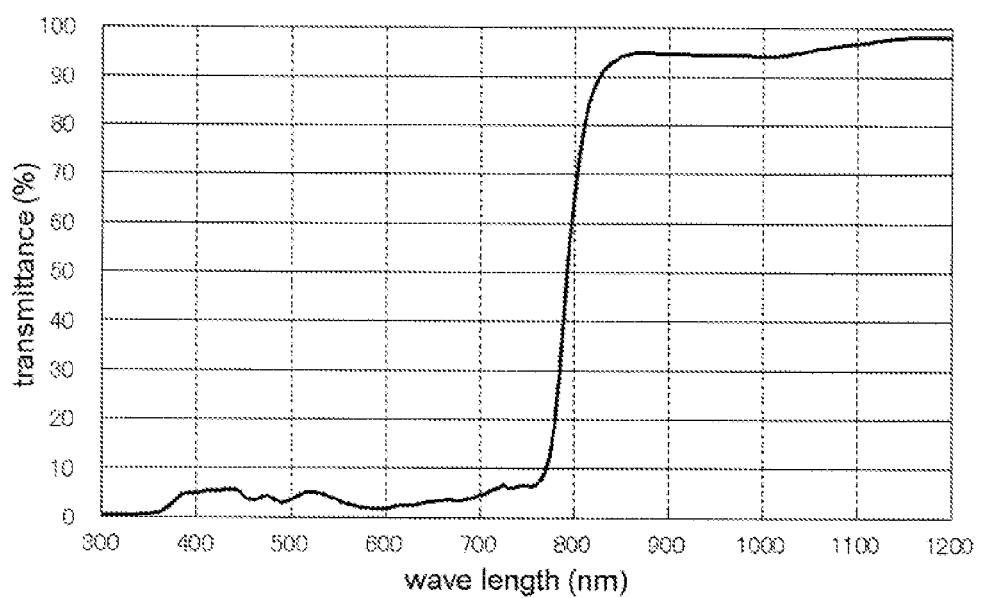
FIG. 6 is a diagram showing a transmission spectrum of a near-infrared pass filter that is used in the solid-state imaging device according to one embodiment of the present invention.

Here, optical characteristics of the first optical layer 21, the second optical layer 25 and the near-infrared pass filter 27*d*, which are used in the solid-state imaging device 12 of the present embodiment will be shown in FIGS. 4 to 6.

FIG. 4 is a diagram showing a transmission spectrum of the first optical layer (dual band pass filter) 21 that is used in the solid-state imaging device 12 of the present embodiment. In FIG. 4, a horizontal axis expresses a wavelength of incident light, and a vertical axis expresses transmittance when measured from a vertical direction relative to the first optical layer 21 as a percentage. As shown in FIG. 4, the first optical layer 21 used in the present embodiment has the optical characteristics of transmitting visible light in the wavelength of from 400 to 700 nm and near-infrared light in the wavelength of from 750 to 950 nm. It goes without saying that the optical characteristics shown in FIG. 4 is one example, and, as the first optical layer 21 used in the present embodiment, as long as it has the optical characteristics of transmitting the visible light and at least a part of the near-infrared light, any dual band pass filter that transmits other wavelength range may be used.

FIG. 5 is a diagram showing transmission spectra of the second optical layers (near-infrared cut filters) 25 used in the solid-state imaging device 12 of the present embodiment. In FIG. 5, a horizontal axis expresses a wavelength of incident light, and a vertical axis expresses transmittance when measured from a vertical direction relative to the second optical layer 25 as a percentage. In FIG. 5, two kinds of a second optical layer (A) and a second optical layer (B) are shown, and a difference of both transmission spectra is due to a difference of the compounds (B) contained.

As shown in FIG. 5, the near-infrared cut filters 25 used in the present embodiment have a function of cutting incident light of the wavelength of from about 600 to 950 nm. It goes without saying that the optical characteristics shown in FIG. 5 is one example, and as the second optical layer 25 used in the present embodiment, an optical layer containing the compound (B) having at least one absorption maximum at the wavelength of from 755 to 1050 nm may be used.

FIG. 6 is a diagram showing a transmission spectrum of the near-infrared pass filter 27*d* used in the solid-state imaging device 12 of the present embodiment. In FIG. 6, a horizontal axis expresses a wavelength of incident light, and a vertical axis expresses transmittance when measured from a vertical direction relative to the near-infrared pass filter 27*d* as a percentage. As shown in FIG. 6, the near-infrared pass filter 27*d* used in the present embodiment shows characteristics of transmitting light on a longer wavelength side than the neighborhood of the wavelength of 750 nm. It goes without saying that the near-infrared pass filter 27*d* that may be used in the present embodiment is not limited to one having the transmission spectrum characteristics shown in FIG. 6 but even one having a wavelength where an absorption occurs on a longer wavelength side or on a shorter wavelength side may be used.

The solid-state imaging device 12 in the present embodiment filters first an ambient light by the first optical layer 21 having the optical characteristics shown in FIG. 4 to transmit the visible light of the wavelength of from 400 to 700 nm and at least a part (specifically, the near-infrared light of the wavelength of from 750 to 950 nm) of the near-infrared light of the wavelength of from 750 to 2500 nm. Then, the visible light and a part of the near-infrared light transmitted through the first optical layer 21 is incident on the second optical layer 25.

At this time, since the second optical layer 25 on the upside of the photodiode 29*d* is provided with an opening, the visible light and a part of the near-infrared light, which transmitted through the first optical layer 21 is incident as it is on the near-infrared pass filter 27*d*. In the near-infrared pass filter 27*d*, as shown in FIG. 6, the visible light of the wavelength of about 750 nm or shorter is absorbed (cut), and the near-infrared light of the wavelength of from 750 to 950 nm is incident on the photodiode 29*d*. Thus, without being influenced by the noise or the like due to the visible light, a distance to the object to be imaged 15 may be obtained with high accuracy.

On the other hand, on the upside of the photodiodes 29*a* to 29*c* (upside of the visible pass filters 27*a* to 27*c*), the second optical layer 25 is provided. Therefore, the visible light and a part of the near-infrared light, which transmitted through the first optical layer 21 are incident on the second optical layer 25. In the second optical layer 25, as shown in FIG. 5, the near-infrared light of the wavelength of about from 600 to 950 nm is absorbed (cut), and the visible light containing respective component lights of RGB is incident via the visible pass filters 27*a* to 27*c* on the photodiodes 29*a* to 29*c*. Thus, since an amount of light of the near-infrared light incident on the photodiodes 29*a* to 29*c* may be largely reduced, without receiving an adverse effect of the noise due to the infrared light, it is possible to capture chromaticity or a shape of the object to be imaged 15 with high accuracy.

Thus, in the solid-state imaging device 12 in the present embodiment, when the optical characteristics of the first optical layer 21 and second optical layer 25 are properly adjusted, the near-infrared light finally incident on the visible light detection pixel may be suppressed.

On the contrary, when only the first optical layer 21 is provided, since the near-infrared light transmitted through the first optical layer 21 is incident as it is on the visible light detection pixel, there is a concern that the visible light may not be detected with high accuracy.

Further, also when only the second optical layer 25 is provided, since the near-infrared light unnecessary for visible light detection pixel is incident, there is a concern that the visible light may not be detected with high accuracy. For example, since a red color resist generally has the optical characteristics of transmitting light of the wavelength of 600 nm or longer, the near-infrared light is incident on a red light detection pixel. Further, since a green color resist or a blue color resist generally has the optical characteristics in which the transmittance increases gradually from the wavelength of about 750 nm, also the near-infrared light may be incident on the green light detection pixel or on the blue light detection pixel.

Figure 7:
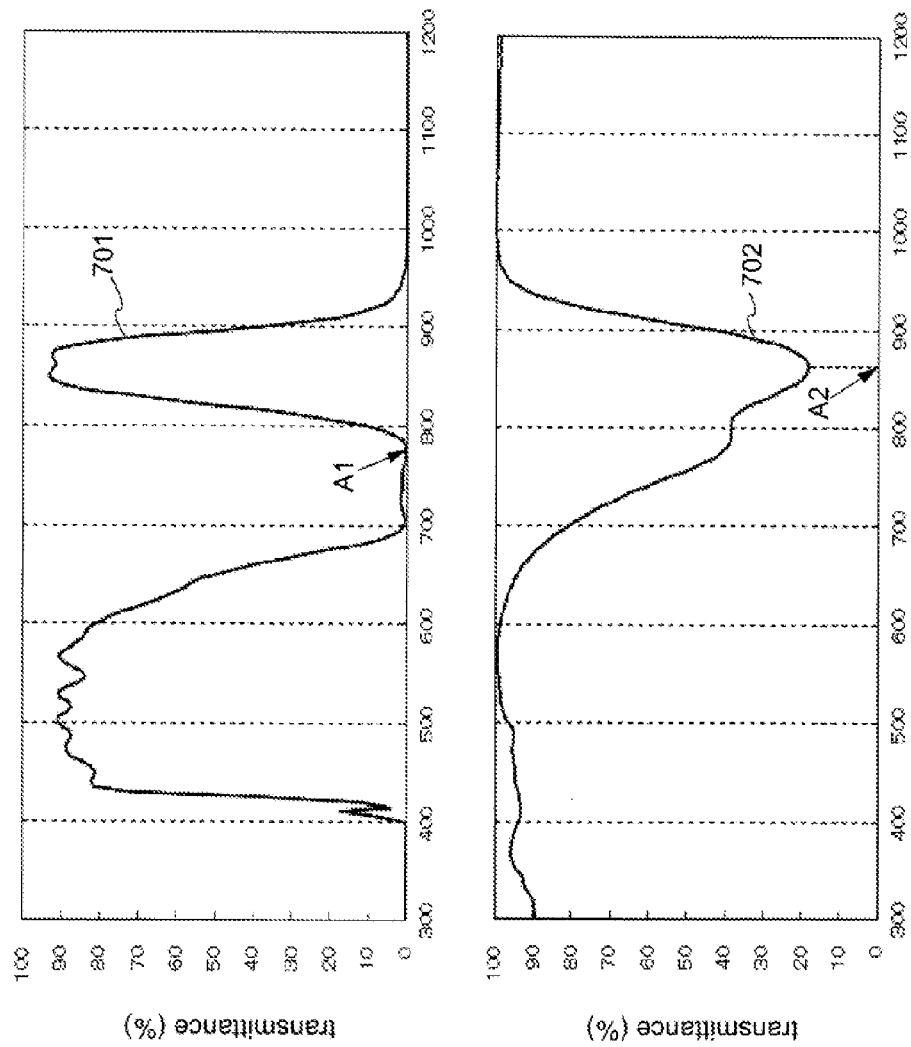
FIG. 7 is a diagram for explaining relationship of optical characteristics between the first optical layer and the second optical layer.

FIG. 7 is a diagram for describing a relationship of the optical characteristics between the first optical layer 21 and the optical layer 25. In FIG. 7, a curve 701 showing the optical characteristics (a transmission spectrum in the incident light in the vertical direction) of the first optical layer 21 and a curve 702 showing the optical characteristics (a transmission spectrum in the incident light in the vertical direction) of the second optical layer 25 are shown. Here, the curve 701 corresponds to the transmission spectrum shown in FIG. 4, and the curve 702 corresponds to a transmission spectrum of the second optical layer (A) shown in FIG. 5.

As was described above, the first optical layer 21 contains the compound (A) having at least one absorption maximum at the wavelength of from 750 to 900 nm. Therefore, in FIG. 7, the transmission spectrum shown with the curve 701 has an absorption in the wavelength of from 600 to 850 nm. The compound (A) is not limited to one kind and a plurality of kinds may be used. Therefore, when a plurality of kinds of compounds are contained as the compound (A), a shape of the curve 701 is determined by the respective optical characteristics (absorption characteristics). In the present specification, a wavelength of an absorption maximum on the longest wavelength side of the absorption maximums generated by at least one compound, that is, an absorption maximum wavelength on the longest wavelength side of the compound (A) is taken as A1.

Further, the second optical layer 25 contains the compound (B) having at least one absorption maximum at the wavelength of from 755 to 1050 nm. Therefore, in FIG. 7, the transmission spectrum shown by the curve 702 has an absorption over the wavelength of from 600 to 950 nm. The compound (B) may also use a plurality of kinds in the same manner as the compound (A). Accordingly, in the present specification, a wavelength of an absorption maximum on the longest wavelength side of the absorption maximums generated by at least one compound, that is, an absorption maximum wavelength on the longest wavelength side of the compound (B) is taken as A2.

At this time, in the solid-state imaging device 12 in the present embodiment, the optical characteristics of the first optical layer 21 and the second optical layer 25 are adjusted such that the absorption maximum wavelength (A2) on the longest wavelength side of the compound (B) is larger than the absorption maximum wavelength (A1) on the longest wavelength side of the compound (A) and a difference of both is from 5 to 150 nm (preferably, from 10 to 120 nm). When the difference of both is less than 5 nm, since light corresponding to the longer wavelength side in the transmission band of the near-infrared light of the first optical layer may not be sufficiently shielded until reaching the visible pass filters 27a to 27c, unnecessary stray light may be incident on the visible light detection pixel, and the color reproducibility tends to be unfavorably degraded. Further, when the difference of the both exceeds 150 nm, since light corresponding to the shorter wavelength side in the transmission band of the near-infrared light of the first optical layer 21 may not be sufficiently shielded until reaching the visible pass filters 27a to 27c, unnecessary stray light may be incident on the visible light detection pixel in the same manner, and the color reproducibility tends to be unfavorably degraded.

Figure 8:
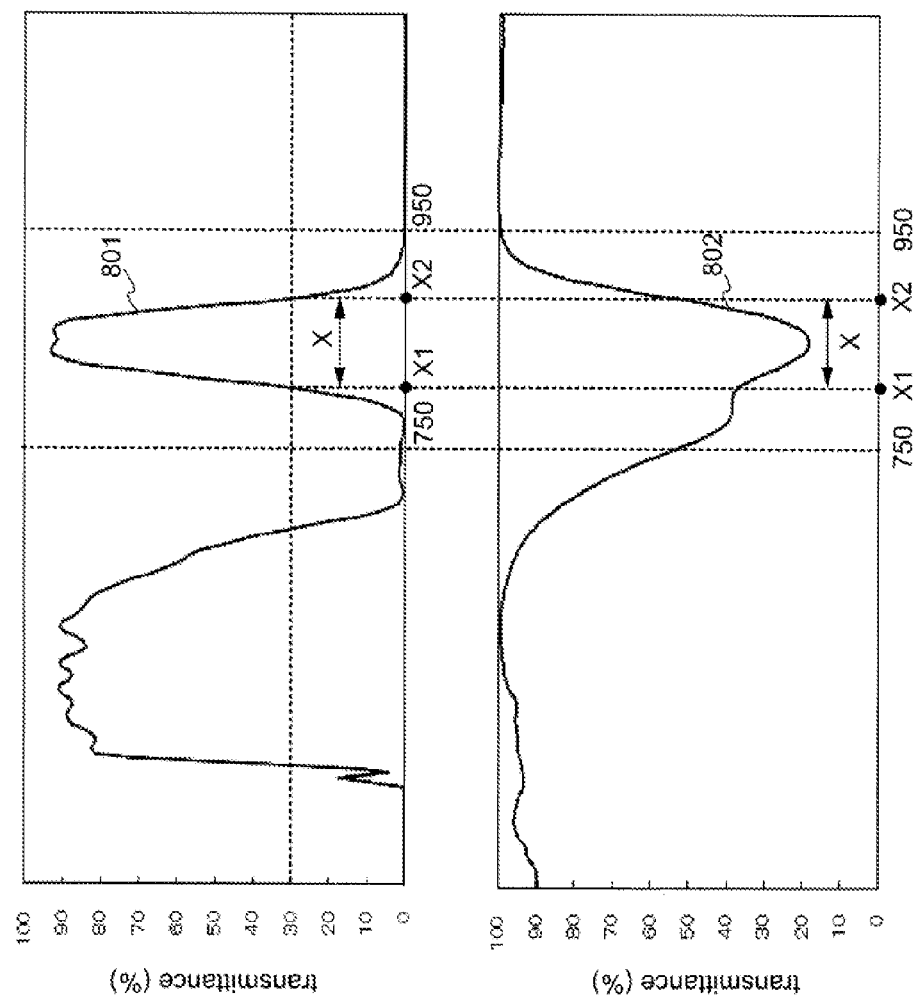
FIG. 8 is a diagram for explaining relationship of optical characteristics between the first optical layer and the second optical layer.

When the optical characteristics of the first optical layer 21 and the optical characteristics of the second optical layer 25 are designed like this, an amount of the near-infrared light until finally reaching the photodiodes 29a to 29c may be suppressed to 70% or smaller (preferably 50% or smaller, further preferably 30% or smaller) of the incident near-infrared light. Specifically, as shown in FIG. 8, the shortest wavelength where the transmittance of the near-infrared light of the wavelength of from 750 to 950 nm becomes 30% or larger when measured from the vertical direction is set to X1 and the longest wavelength where the transmittance becomes 30% or smaller is set to X2. Then, when a wavelength band (wavelength range) from the wavelength X1 to the wavelength X2 is taken as X, a product of an average transmittance (for example, when the X1 is at 810 nm and the X2 is at 900 nm, an average value of the transmittances in the respective wavelengths of from 810 to 900 nm) of the first optical layer 21 when measured from a vertical direction of the near-infrared light in the wavelength band (X) and an average transmittance of the second optical layer 25 when measured from the vertical direction of the near-infrared light in the same wavelength band (X) becomes 70% or smaller (preferably 50% or smaller, further preferably 30% or smaller). In FIG. 8, a curve 801 shows the optical characteristics (a transmission spectrum in the incident light in the vertical direction) of the first optical layer 21 and a curve 802 shows the optical characteristics (a transmission spectrum in the incident light in the vertical direction) of the second optical layer 25.

It goes without saying that the effect like this is the same as when the second optical layer (B) shown in FIG. 5 is used as the second optical layer 25.

Figure 9:
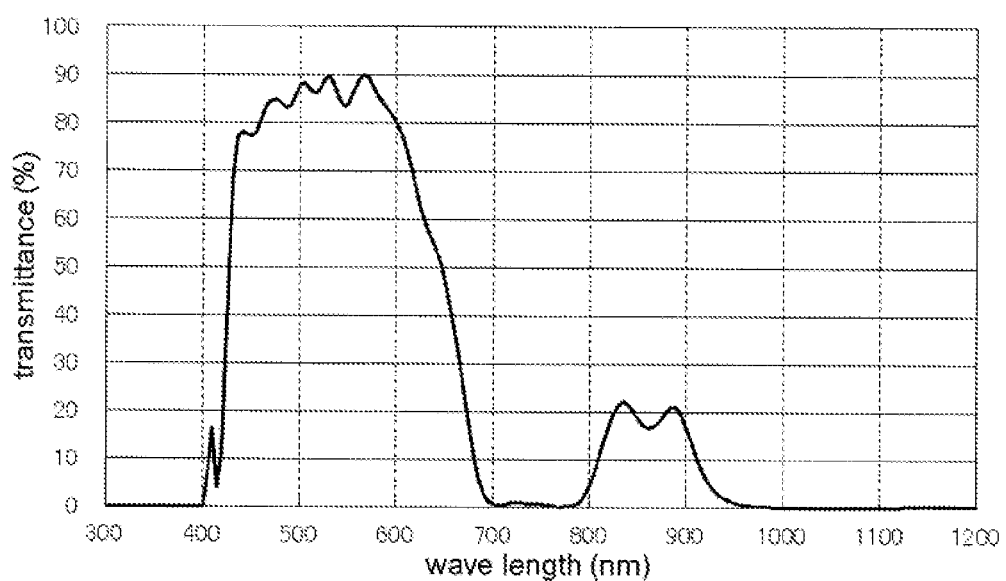
FIG. 9 is a diagram showing a result of calculation of a product of an average transmittance of the first optical layer and an average transmittance of the second optical layer when a near-infrared light is measured from a vertical direction.

FIG. 9 is a diagram showing a result of a calculation of a product of the average transmittance of the first optical layer and the average transmittance of the second optical layer when measured the near-infrared light from a vertical direction. Specifically, a calculation result obtained by multiplying the respective transmittances of the transmission spectrum shown by the curve 701 by the respective transmittances of the transmission spectrum shown by the curve 702 in FIG. 7 is shown.

As obvious from FIG. 9, it is found that the transmittance in the range of the wavelength of from 800 to 950 nm is about 20% or smaller. This means that when the first optical layer 21 and the second optical layer 25 are seen as one optical layer, exit light is cut by 80% or more relative to the incident light. That is, it is shown that the near-infrared light transmitted through the first optical layer 21 is sufficiently cut by the second optical layer 25, incidence of the near-infrared light on the visible light detection pixel is reduced as large as possible. Thus, when the first optical layer 21 and the second optical layer 25 are used in combination and the optical characteristics of the both are adjusted so as to satisfy the above condition, the visible light and the near-infrared light respectively may be selectively incident on the visible light detection pixel and the near-infrared light detection pixel. As a result, a solid-state imaging device combining a distance sensing function and excellent color reproducibility may be realized.

Further, different from conventional examples, there is no need of separately providing both of the visible pass filter and the near-infrared pass filter on the upside of the visible light detection pixel and the near-infrared light detection pixel. Therefore, a solid-state imaging device that has minimum production costs and high detection accuracy may be realized.

EXAMPLES

In what follows, the first optical layer and the second optical layer shown in the above embodiment will be described in more detail with reference to examples. However, the above embodiment is not at all limited by these examples. "Parts" means "parts by weight" unless clearly stated otherwise. Further, measurement methods of the respective physical property values and evaluation methods of the physical properties are as shown below.

<Molecular Weight>

A molecular weight of a resin was measured according to the following method by taking the solubility in a solvent of the respective resins or the like into consideration.

By using a gel permeation chromatography (GPC) apparatus manufactured by WATERS Corporation (150C type, column: H type column manufactured by Tosoh Corporation, a developing solvent: o-dicholorobenzene), a weight average molecular weight (Mw) and a number average molecular weight (Mn) in terms of reference polystyrene were measured.

<Glass Transition Temperature (Tg)>

A differential scanning colorimeter (DSC6200) manufactured by SII Nanotechnology Inc. was used to measure at a temperature increase rate: 20° C./minute under nitrogen gas flow.

<Spectral Transmittance>

The (X1) and (X2) of the first optical layer, and the transmittances in the respective wavelength regions of the first optical layer were measured by using a spectral photometer (U-4100) manufactured by Hitachi High-Technologies Corporation.

Figure 10:
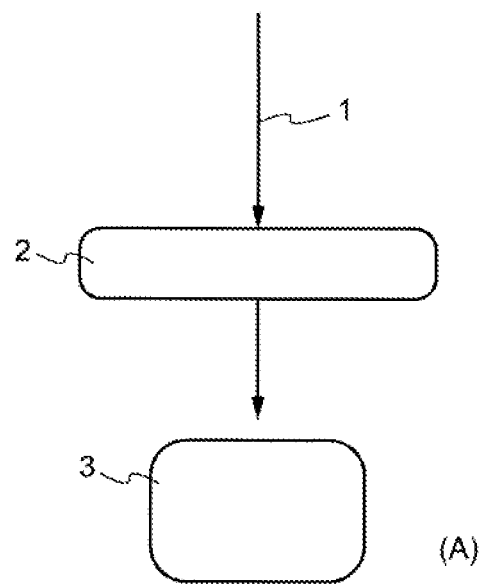
FIG. 10 is a diagram showing constitutions for measuring a transmission spectrum from a vertical direction and from a direction of 30° to the vertical direction.
Figure 10:
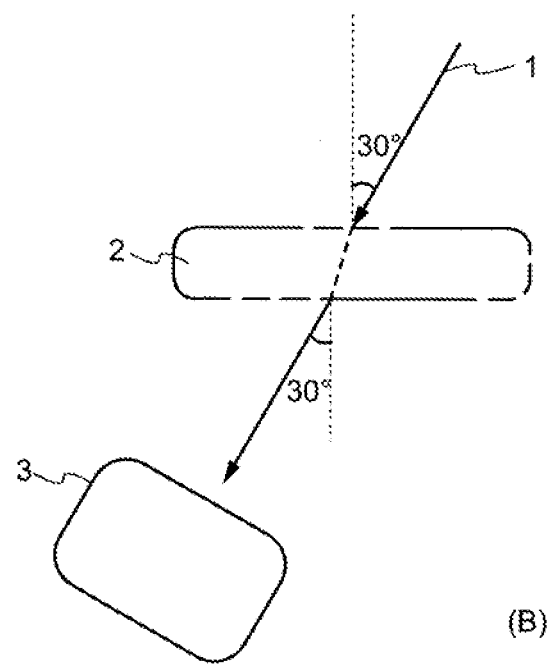

Here, the transmittances when measured from a vertical direction of the first optical layer and the second optical layer were obtained by measuring light transmitted vertically to a filter as shown in FIG. 10(A). Further, in the transmittance when measured from an angle of 30° to the vertical direction of the optical filter, light transmitted at an angle of 30° to the vertical direction of the filter as shown in FIG. 10(B) was measured.

[Example of Synthesis]

The compound (A) used in the above embodiment may be synthesized according to a generally known method and may be synthesized with reference to methods described in, for example, JP 3366697 B1, JP 2846091 B1, JP 2864475 B1, JP 3094037 B1, JP 3703869 B1, JP S60-228448 A, JP H01-146846 A, JP H01-228960 A, JP 4081149 B1, JP 863-124054 A, "Phthalocyanine-Chemistry and Function-" (IPC, 1997), JP 2007-169315 A, JP 2009-108267 A, JP 2010-241873 A, JP 3699464 B1, JP 4740631 A and the like.

<Example 1 of Resin Synthesis Relating to Compound (A)>

Into a nitrogen-substituted reaction vessel, 100 parts of 8-methyl-8-Methoxycarbonyttetracyclo [4.4.0.1$^{2,5}$.1$^{7,10}$] dodeca-3-ene represented by the following formula (a), 18 parts of 1-hexene (a molecular weight regulator) and 300 parts of toluene (a ring opening polymerization reaction solvent) were charged, and this solution was heated to 80° C. Next, to the solution in the reaction vessel, as a polymerization catalyst, 0.2 part of a toluene solution of triethyl aluminum (concentration: 0.6 mol/liter) and 0.9 part of a toluene solution of methanol-modified tungsten hexachloride (concentration: 0.025 mol/liter) were added, and, by heating and stirring an obtained solution at 80° C. for 3 hours to perform a ring opening polymerization reaction, a solution of ring-opened polymer was obtained. A polymerization conversion rate in this polymerization reaction was 97%.

[Formula 1]

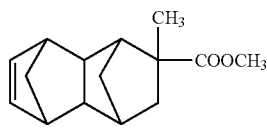

(a)

One thousand parts of thus obtained solution of a ring-opened polymer were charged in an autoclave, to this solution of the ring-opened polymer, 0.12 part of RuHCl (CO)[P(CeH$_5$)$_3$]$_3$ was added, followed by heating and stirring for 3 hours under conditions of hydrogen gas pressure of 100 kg/cm$^2$ and a reaction temperature of 165° C. to perform a hydrogenation reaction. After cooling the obtained reaction solution (a solution of hydrogenated polymer), a hydrogen gas was pressure-released. This reaction solution was charged into a large amount of methanol to separate and recover a coagulated matter, followed by drying this, and a hydrogenated polymer (hereinafter, referred to also as a "resin A") was obtained. The obtained resin A had the number average molecular weight (Mn) of 32,000, the weight average molecular weight (Mw) of 137,000, and the glass transition temperature (Tg) of 165° C.

<Preparation of First Optical Layer>

In the present embodiment, as the first optical layer, an optical filter that has a base material made of a transparent resin substrate having a resin layer on both surfaces and has a near-infrared light selective transmission band in the neighborhood of the wavelength of from 810 to 900 nm was prepared. In a vessel, 100 parts of the resin A obtained in the example of resin synthesis 1, as the compound (A), 0.03 part of a compound (a-1: an absorption maximum wavelength of 698 nm in dichloromethane), 0.05 part of a compound (a-2: an absorption maximum wavelength of 738 nm in dichloromethane), and 0.03 parts of a compound (a-3: an absorption maximum wavelength of 770 nm in dichloromethane) where the respective compounds have the following structures, and methylene chloride were added to obtain a solution having a resin concentration of 20% by weight. Then, the obtained solution was casted on a smooth glass plate, dried at 20° C. for 8 hours, followed by peeling from the glass plate. A peeled coated film was further dried at 100° C. for 8 hours under reduced pressure and a base material made of a transparent resin substrate of a thickness of 0.1 mm, a length of 60 mm, and a width of 60 mm was obtained.

[Formula 2]

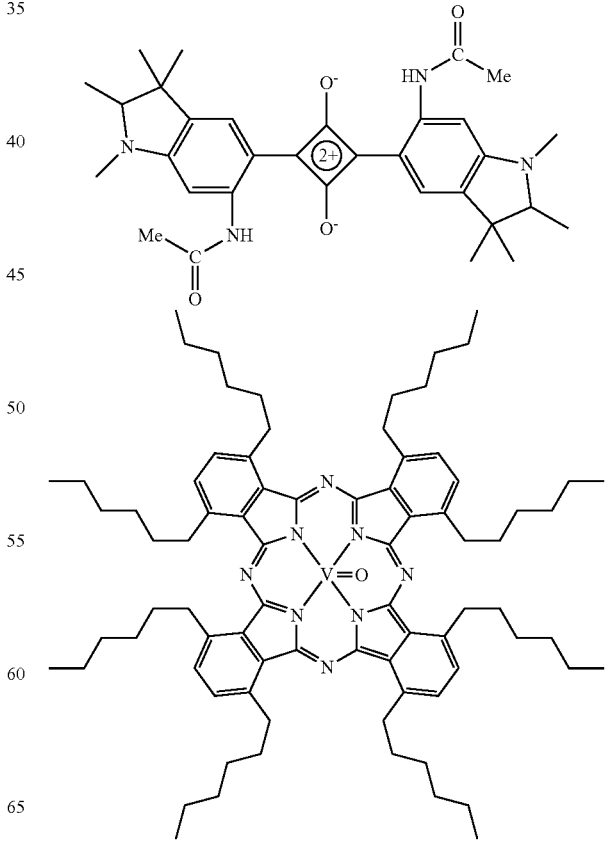

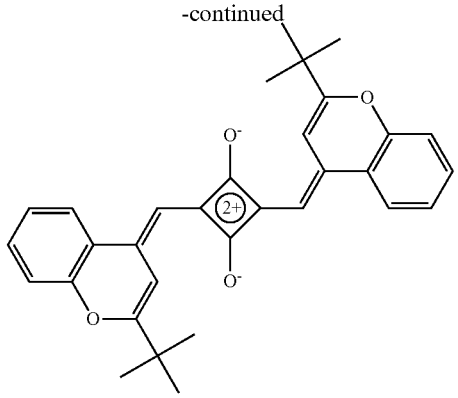

On one surface of the obtained transparent resin substrate, a resin composition (1) having the following composition was coated by a bar coater, followed by heating at 70° C. for 2 minutes in an oven to volatilize and remove the solvent. At this time, a coating condition of the bar coater was adjusted such that a thickness after drying becomes 2 μm. Next, by exposing using a conveyer type exposing machine (an exposure amount: 500 mJ/cm², 200 mW), the resin composition (1) was cured to form a resin layer on the transparent resin substrate. Similarly, also on another surface of the transparent resin substrate, a resin layer made of the resin composition (1) was formed, thus, a base material having the resin layer on both surfaces of the transparent resin substrate containing the compound (A) was obtained.

Resin composition (1): 60 parts by weight of tricyclodecanedimethanol acrylate, 40 parts by weight of dipentaerythritol hexaacrylate, 5 parts by weight of 1-hydroxycyclohexyl phenyl ketone, methyl ethyl ketone (solvent, solid content concentration (TSC): 30%)

Subsequently, a dielectric multilayer film (I) was formed on one surface of the obtained base material, a dielectric multilayer film (II) was further formed on another surface of the base material, and an optical filter having a thickness of about 0.109 mm was obtained.

The dielectric multilayer film (I) was formed by alternately laminating a silica (SiO₂) layer and a titania (TiO₂) layer at a deposition temperature of 100° C. (26 layers in total). The dielectric multilayer film (II) was formed by alternately laminating a silica (SiO₂) layer and a titania (TiO₂) layer at a deposition temperature of 100° C. (20 layers in total). In any case of the dielectric multilayer films (I) and (II), a silica layer and a titania layer are alternately laminated in an order of a titania layer, a silica layer, a titania layer, . . . a silica layer, a titania layer, and a silica layer from a base material side, and the outermost layer of the optical filter was the silica layer.

The dielectric multilayer films (I) and (II) were designed as shown below. Regarding a thickness of each layer and the number of layers, so as to accomplish a reflection prevention effect in the visible region and selective transmission/reflection performance in the near-infrared region, according to the wavelength dependency of the base material refractive index and the absorption characteristics of the compound (A) used, an optical thin film design software (Essential Macleod, manufactured by Thin Film Center Inc.) was used to optimize. When performing the optimization, in the present embodiment, input parameters (Target values) to the software were set as shown in the following Table 1.

TABLE 1

| dielectric | wave | Input parameters to the software | | | |
|---|---|---|---|---|---|
| multilayer film | length (nm) | Incident Angle | Required Value | Target Tolerance | Type |
| (I) | 400~700 | 0 | 100 | 1 | Transmittance |
|  | 705~825 | 0 | 0 | 0.5 | Transmittance |
|  | 830~900 | 0 | 100 | 0.5 | Transmittance |
| (II) | 420~700 | 0 | 100 | 1 | Transmittance |
|  | 835~900 | 0 | 100 | 0.5 | Transmittance |
|  | 905~1200 | 0 | 0 | 0.5 | Transmittance |

As a result of optimization of the film constitution, in the present example, the dielectric multilayer film (I) became a multilayer deposition film having the lamination number of 26 formed by alternately laminating a silica layer having a film thickness of from 19 to 387 nm and a titania layer having a film thickness of from 8 to 99 nm, and the dielectric multilayer film (II) became a multilayer deposition film having the lamination number of 20 formed by alternately laminating a silica layer having a film thickness of from 31 to 191 nm and a titania layer having a film thickness of from 19 to 126 nm. One example of an optimized film constitution is shown in Table 2.

TABLE 2

| dielectric multilayer film | layer | film material | physical thickness of film (nm) | optical thickness of film (nd) |
|---|---|---|---|---|
| (I) | 1 | SiO₂ | 81.3 | 0.214 λ |
|  | 2 | TiO₂ | 82.1 | 0.361 λ |
|  | 3 | SiO₂ | 18.7 | 0.049 λ |
|  | 4 | TiO₂ | 13.7 | 0.06 λ |
|  | 5 | SiO₂ | 386.9 | 1.018 λ |
|  | 6 | TiO₂ | 8.1 | 0.036 λ |
|  | 7 | SiO₂ | 230.5 | 0.606 λ |
|  | 8 | TiO₂ | 13.1 | 0.058 λ |
|  | 9 | SiO₂ | 199.8 | 0.526 λ |
|  | 10 | TiO₂ | 98.7 | 0.433 λ |
|  | 11 | SiO₂ | 190.5 | 0.501 λ |
|  | 12 | TiO₂ | 11.6 | 0.051 λ |
|  | 13 | SiO₂ | 193.6 | 0.509 λ |
|  | 14 | TiO₂ | 14.9 | 0.065 λ |
|  | 15 | SiO₂ | 37.0 | 0.097 λ |
|  | 16 | TiO₂ | 17.4 | 0.077 λ |
|  | 17 | SiO₂ | 208.9 | 0.55 λ |
|  | 18 | TiO₂ | 12.4 | 0.030 λ |
|  | 19 | SiO₂ | 229.8 | 0.080 λ |
|  | 20 | TiO₂ | 12.8 | 0.056 λ |
|  | 21 | SiO₂ | 231.1 | 0.608 λ |
|  | 22 | TiO₂ | 14.4 | 0.063 λ |
|  | 23 | SiO₂ | 216.2 | 0.569 λ |
|  | 24 | TiO₂ | 31.0 | 0.136 λ |
|  | 25 | SiO₂ | 31.9 | 0.084 λ |
|  | 26 | TiO₂ | 25.3 | 0.111 λ |
|  | base material | | | |
| (II) | 27 | TiO₂ | 18.7 | 0.082 λ |
|  | 28 | SiO₂ | 30.5 | 0.08 λ |
|  | 29 | TiO₂ | 125.5 | 0.551 λ |
|  | 30 | SiO₂ | 190.0 | 0.5 λ |
|  | 31 | TiO₂ | 113.3 | 0.498 λ |
|  | 32 | SiO₂ | 190.9 | 0.502 λ |
|  | 33 | TiO₂ | 113.5 | 0.498 λ |
|  | 34 | SiO₂ | 188.0 | 0.495 λ |
|  | 35 | TiO₂ | 110.5 | 0.485 λ |
|  | 36 | SiO₂ | 182.3 | 0.479 λ |
|  | 37 | TiO₂ | 106.3 | 0.467 λ |
|  | 38 | SiO₂ | 180.8 | 0.470 λ |
|  | 39 | TiO₂ | 109.9 | 0.483 λ |
|  | 40 | SiO₂ | 188.0 | 0.494 λ |
|  | 41 | TiO₂ | 112.8 | 0.495 λ |
|  | 42 | SiO₂ | 188.9 | 0.470 λ |
|  | 43 | TiO₂ | 112.6 | 0.495 λ |

TABLE 2-continued

| dielectric multilayer film | layer | film material | physical thickness of film (nm) | optical thickness of film (nd) |
|---|---|---|---|---|
| | 44 | SiO$_2$ | 188.6 | 0.496 λ |
| | 45 | TiO$_2$ | 113.2 | 0.497 λ |
| | 46 | SiO$_2$ | 97.4 | 0.256 λ |

* λ = 550 nm

Figure 11:
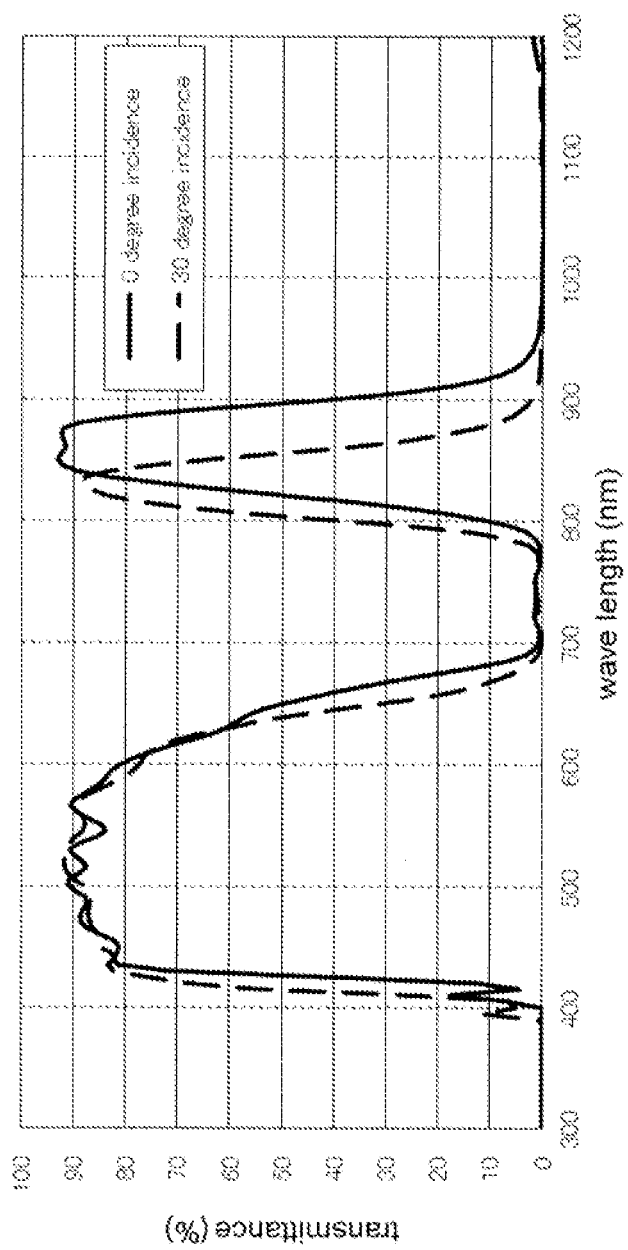
FIG. 11 is a diagram showing transmission spectra of the first optical layer used in the solid-state imaging device according to one embodiment of the present invention.

A spectral transmittance and reflectance of this optical filter were measured to evaluate the optical characteristics in the respective wavelength regions. As a result of the evaluation, in the present embodiment, since the (X1) was 812 nm, the (X2) was 904 nm, a center wavelength (a wavelength defined by a formula of (X1+X2)/2) of a wavelength band (X) was 858 nm, an average transmittance when measured from a vertical direction in the wavelength band (X) was 73%, an average transmittance when measured from a direction of a diagonal angle of 30° in the wavelength band (X) was 45%, an average transmittance when measured from a vertical direction in the wavelength of from 430 to 620 nm was 85%, an average transmittance when measured from a vertical direction in the wavelength of from 430 to 470 nm was 82%, an average transmittance when measured from a vertical direction in the wavelength of from 520 to 560 nm was 88%, and an average transmittance when measured from a vertical direction in the wavelength of from 580 to 620 nm was 79%, and it was confirmed that the optical filter has excellent transmission characteristics in the visible region and a part of the near-infrared wavelength band. Spectra obtained by measurement are shown in FIG. 11.

<Example 2 of Resin Synthesis Relating to Compound (B)>

In a reaction vessel, 14 g of benzyl methacrylate, 12 g of N-phenylmaleimide, 15 g of 2-hydroxyethylmethacrylate, 10 g of styrene and 20 g of methacrylic acid were dissolved in 200 g of propylene glycol monomethyl ether acetate, followed by further adding 3 g of 2,2'-azoisobutyronitrile and 5 g of a-methylstyrene dimer. After purging the inside of the reaction vessel with nitrogen, followed by heating at 80° C. for 5 hours while stirring and bubbling nitrogen, a solution containing a binder resin (hereinafter, referred to as a binder resin solution (P), solid content concentration of 35% by mass) was obtained. When a molecular weight in terms of polystyrene of the obtained binder resin was measured using a gel permeation chromatography (GPC) apparatus (GPC-104 type, column: one obtained by bonding 3 LF-604 and one KF-602 manufactured by Showa Denko K.K., a developing solvent: tetrahydrofuran), the weight average molecular weight (Mw) was 9700, the number average molecular weight (Mn) was 5700, and the Mw/Mn was 1.70.

<Preparation of Curable Resin Composition A>

By mixing 6.6 parts of NK-5060 that is a cyanine dye manufactured by Hayashibara Co., Ltd. (a maximum absorption wavelength in methyl ethyl ketone: 864 nm), 507 parts of cyclohexanone, 100 parts of the above binder resin solution (P), 175 parts of Resitop C-357PGMEA manufactured by Gunei Chemical Industry Co., Ltd. (mainly made of a compound having the structure described below, a propylene glycol monomethyl ether acetate solution having a solid content concentration of 20% by mass), 2.23 parts of bis-(4-tert-butylphenyl)iodonium nonafluorobutanesulfonate manufactured by ADEKA Corporation and 0.14 part of FTX-218D manufactured by NEOS COMPANY LIMITED, a curable resin composition A was prepared.

[Formula 3]

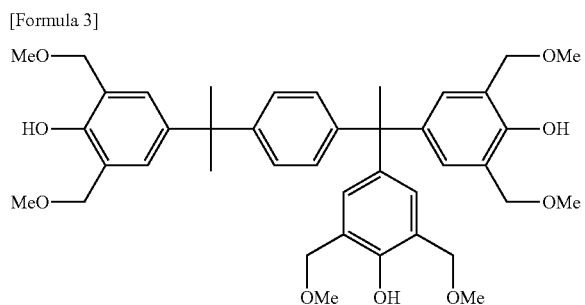 [SMILES: COCc1cc(C(C)(C)c2ccc(C(C)(c3cc(COC)c(O)c(COC)c3)c3cc(COC)c(O)c(COC)c3)cc2)cc(COC)c1O]

<Preparation of Second Optical Layer>

On a glass substrate, the above curable resin composition A was coated by a spin coating method, followed by heating at 100° C. for 120 seconds, further followed by heating at 140° C. for 300 seconds, and a second optical layer having a thickness of 0.50 μm was prepared on the glass substrate. The film thickness was measured by a stylus-type profiler (Alpha-Step IQ manufactured by Yamato Scientific Co., Ltd.).

<Spectral Transmittance>

The transmittance in each wavelength region of the second optical layer prepared on the glass substrate was measured compared to the glass substrate using a spectral photometer (V-7300 manufactured by JASCO CORPORATION).

Figure 12:
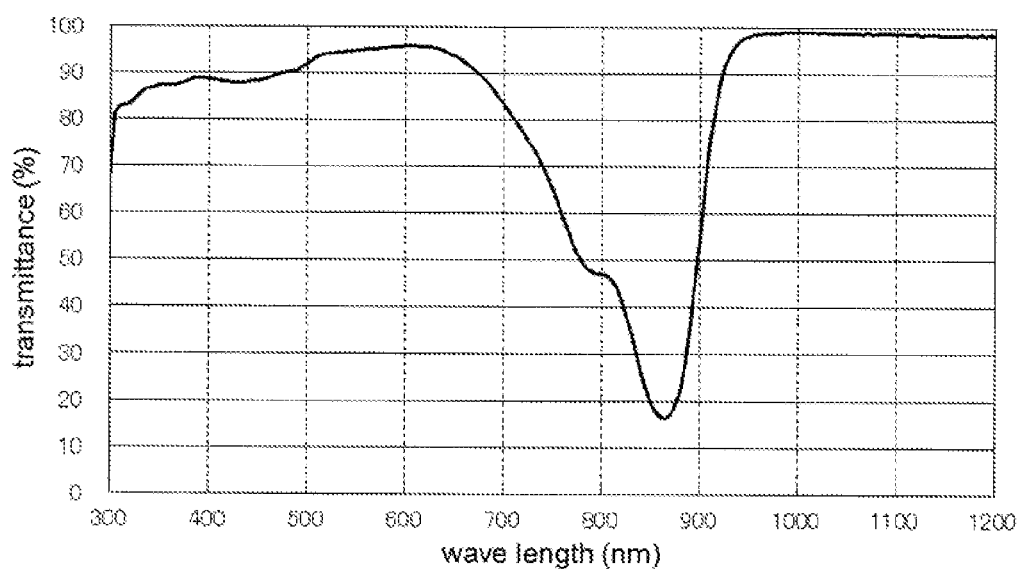
FIG. 12 is a diagram showing transmission spectrum of the second optical layer used in the solid-state imaging device according to one embodiment of the present invention.

The spectrum obtained by measurement is shown in FIG. 12.

In the present example, a product of an average transmittance of the first optical layer when measured from a vertical direction of the near-infrared light in the wavelength band (X) and an average transmittance of the second optical layer when measured from the vertical direction of the near-infrared light in the wavelength band (X) was 20%, a product of an average transmittance of the first optical layer when measured from a direction of a diagonal angle of 30° of the near-infrared light in the wavelength band (X) and an average transmittance of the second optical layer when measured from a direction of a diagonal angle of 30° of the near-infrared light in the wavelength band (X) was 14%, a product of an average transmittance of the first optical layer when measured from a vertical direction of the transmitted light in the wavelength of from 430 to 620 nm and an average transmittance of the second optical layer when measured from the vertical direction of the transmitted light in the wavelength of from 430 to 620 nm was 79%, a product of an average transmittance of the first optical layer when measured from a vertical direction of the transmitted light in the wavelength of from 430 to 470 nm and an average transmittance of the second optical layer when measured from the vertical direction of the transmitted light in the wavelength of from 430 to 470 nm was 73%, a product of an average transmittance of the first optical layer when measured from a vertical direction of the transmitted light in the wavelength of from 520 to 560 nm and an average transmittance of the second optical layer when measured from the vertical direction of the transmitted light in the wavelength of from 520 to 560 nm was 83%, and a product of an average transmittance of the first optical layer when measured from a vertical direction of the transmitted light in the wavelength of from 580 to 620 nm and an average transmittance of the second optical layer when measured from the vertical direction of the transmitted light in the wavelength of from 580 to 620 nm was 76%.

EXPLANATION OF REFERENCE SIGNS

1: light
2: spectral photometer
3: optical filter
10: imaging device (camera)
11: light source
12: solid-state imaging device (image sensor)
13: signal processor
14: main controller
15: object to be imaged
16: package
17: pixel part
18: terminal part
19: enlargement part
20: pixel
21: first optical layer (dual band pass filter)
22: first gap
23: micro-lens array
24: second gap
25: second optical layer (near-infrared cut filter)
26: third gap
27a to 27c: visible pass filters
27d: near-infrared pass filter
28: insulator
29a to 29d: photodiodes
30: support substrate

The invention claimed is:

1. A solid-state imaging device comprising:
a first optical layer that transmits visible light and at least a part of near-infrared light;
a second optical layer that absorbs at least a part of the near-infrared light; and
a pixel array that includes a first light-receiving element that detects the visible light transmitted through the first optical layer and the second optical layer and a second light-receiving element that detects the near-infrared light transmitted through the first optical layer,
wherein the second optical layer has an opening at a part corresponding to the second light-receiving element;
the first optical layer includes a compound (A) having at least one absorption maximum at the wavelength of from 600 to 900 nm;
the second optical layer includes a compound (B) having at least one absorption maximum at the wavelength of from 755 to 1050 nm; and
an absorption maximum wavelength on a longest wavelength side of the compound (B) is larger than an absorption maximum wavelength on the longest wavelength side of the compound (A), and a difference between both is from 5 to 150 nm.

2. The solid-state imaging device according to claim 1, wherein the second optical layer absorbs at least a part of the near-infrared light transmitted through the first optical layer.

3. The solid-state imaging device according to claim 1, wherein the first optical layer includes a translucent resin composition containing the compound (A).

4. The solid-state imaging device according to claim 1, wherein the second optical layer includes a curable resin composition containing the compound (B).

5. The solid-state imaging device according to claim 1, wherein the compound (A) includes a coloring material that absorbs at least a part of the near-infrared light.

6. The solid-state imaging device according to claim 1, wherein the compound (B) has an absorption maximum at the wavelength of from 820 to 880 nm.

7. The solid-state imaging device according to claim 1, wherein the compound (A) includes at least one kind of compound selected from the group consisting of squarylium-based compounds, phthalocyanine-based compounds, naphthalocyanine-based compounds, croconium-based compounds, hexaphyrin-based compounds and cyanine-based compounds.

8. The solid-state imaging device according to claim 1, wherein the compound (B) includes at least one kind of compound selected from the group consisting of diiminium-based compounds, squarylium-based compounds, cyanine-based compounds, phthalocyanine-based compounds, naphthalocyanine-based compounds, quaterrylene-based compounds, aminium-based compounds, iminium-based compounds, azo-based compounds, anthraquinone-based compounds, porphyrine-based compounds, pyrrolopyrrole-based compounds, oxonol-based compounds, croconium-based compounds, hexaphyrin-based compounds, metal dithiol-based compounds, and copper compounds.

* * * * *